United States Patent [19]

La Nave

[11] 4,427,939
[45] Jan. 24, 1984

[54] ELECTRONIC PHASE SEQUENCE INDICATOR FOR THREE-PHASE ELECTRIC SYSTEMS

[76] Inventor: Gaetano La Nave, Via Roma, 8° Traversa, Palazzo CE.DA.MO, 80017 Melito, Italy

[21] Appl. No.: 253,156

[22] Filed: Apr. 10, 1981

[30] Foreign Application Priority Data

Apr. 11, 1980 [IT] Italy .................... 40417 A/80

[51] Int. Cl.³ ........................ G01N 25/00
[52] U.S. Cl. ...................... 324/86; 328/133
[58] Field of Search .......... 324/83 R, 86, 127; 328/133

[56] References Cited

U.S. PATENT DOCUMENTS

| | | | |
|---|---|---|---|
| 2,583,798 | 1/1952 | Rowell et al. | 324/86 |
| 3,253,218 | 5/1966 | Mayer | 324/86 |
| 3,584,299 | 6/1971 | Csete | 324/127 |

*Primary Examiner*—Michael J. Tokar

*Attorney, Agent, or Firm*—Watson, Cole, Grindle & Watson

[57] ABSTRACT

An electronic phase-sequence indicator for indicating the cyclic sequence order for three-phase electric systems using a single-phase indicator-detector having an ammeter circuit and a voltmeter circuit interconnected to the three-phase system with resistors and capacitors, or alternatively with inductances and capacitors. The voltmeter moving element is placed between the pole pieces of a ferromagnetic circuit and is composed of a small freely rotatable frame, upon which the voltmeter small coil is wound and which is composed of many turns of a very thin copper wire. Upon the axle of the small frame two spiral springs are mounted having the functions of determining the counteracting torque and of conveying the voltmeter current to the small coil. The voltmeter pointer is mounted upon the axle of the voltmeter moving element and is of the center-zero type, with a dial, divided by a line into two sectors, each of which respectively represents a predetermined indication for the correct and simple use of the sequence-phase indicator.

13 Claims, 12 Drawing Figures

$$R_1 = R_3 = (Z_v + R_2) \simeq R_2$$

$R_1 = R_3 = (Z_v + R_2) \simeq R_2$

ELECTRONIC PHASE SEQUENCE INDICATOR FOR THREE-PHASE ELECTRIC SYSTEMS

BACKGROUND OF THE INVENTION

The three line wires of a three-phase electric system, generally indicated by the numerals 1, 2, 3 or by the letters R, S, T, carry three sinusoidal electric alternating-current voltages, mutually shifted by a 120° angle, are called "phases" of the system, and in the course of some technical operations it is necessary to be able to recognize, i.e. to single out, quickly and exactly said wires. Practically speaking, in many cases it is necessary to be able to state with absolute certainty which wire represents the phase "one", which the phase "two" and which the phase "three". In the present state of the art, two systems are mainly used to this end: one system utilizes a device composed of two gas-filled filament lamps with condenser or inductor, star-connected; another system employs a small asynchronous motor, previously calibrated, constituted by three circuits, of the voltmeter type, wound upon ferromagnetic cores arranged on a plane according to the apices of an equilateral triangle and electrically star-connected, between whose pole shoes an aluminum disc can rotate, which is subjected to the action of the rotating magnetic field produced by the three circuits.

SUMMARY OF THE INVENTION

We will start by recalling some rudiments of general principles of three-phase electric systems, and by describing the single-phase detector-indicator device with the function of a wattmeter of the center-zero type, which has been devised to achieve our purpose.

We observe that in a symmetrical three-phase electric system, as we have when considering the lines distributing the electric energy along the national network system, the three so-called "phase voltages" are mutually shifted by 120° angles, so that anyone of the three phases may be arbitrarily indicated as "phase one" or "phase two" or "phase three".

The real, true problem is reduced, therefore, to the discrimination between the two remaining phases.

For the sake of clarity, let us suppose that the first of the three line wires has been chosen to represent the "phase one". It remains to be established which of the two remaining wires represents the "phase two", and which the "phase three". On the basis of what we have said, the situation of the wires, as reference numerals for the phases, will be that of FIG. 1 or that of FIG. 4. (see the numerals indicated at left of the Figures, near the terminals).

In the enclosed drawings, the circuits and the vectorial diagrams are shown of an indicating cyclical apparatus according to the invention.

DESCRIPTION OF THE PREFERRED EMBODIMENT

Figure 1:
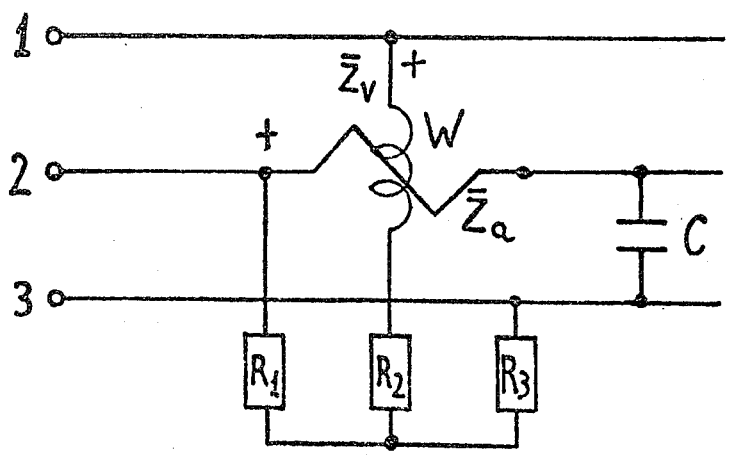
FIG. 1 shows the circuit of the apparatus, including a detecting indicating single-phase device, according to one embodiment of the invention.

The single-phase indicating apparatus works as a single-phase wattmeter of the center-zero point type, and therefore, with an ammeter circuit and a voltmeter circuit. Its particularly consists in the fact that the ammeter circuit is composed of a small coil or spool of thin copper wire, with a very large number of turns, as opposed to the case of a conventional wattmeter, in which the ammeter circuit is composed of few turns of a wire having a large cross-section. The voltmeter circuit is composed of a small rotatable frame on which many turns of a thin wire are wound, and provided with spiral springs in order to allow the determination of the counteracting torque and the feeding of the current; the whole as in a wattmeter of the conventional type.

This particularity of the ammeter circuit is needed because the ammeter current must have a limited value (of the order of 10 to 20 mA), to the end of reducing, as much as it is possible, the values of the capacitor and of the inductor which will cause this current, and, therefore, the effective sizes of these components; indeed, it will just be the value of this capacity or of this inductance which will fix the value of the current which will circulate in the ammeter circuit. Substantially, the ammeter magnetic field must be achieved through the use of many turns and a weak current, in order to limit the dimensions (size) of the other components which will be part of the whole. The voltmeter current will have a limited value, 2 to 4 mA. These values are purely exemplary and indicative since, the more sensitive the detector will be, the more easy will it be to limit the value of this current.

The device may be of an electrodynamic type or of the induction type or else of the ferro-dynamic type, but the last-named type appears to be more suitable to the purpose for reasons of weight, size, and expense. In effect, in order to realize the described apparatus, it will suffice, in a common and cheap magneto-electric instrument of the center-zero type for direct current, to substitute for the permanent magnet a small ferro-magnetic circuit on which the amperometric coil will be wound, having a very large number of thin wire turns. In effect, since the detector must only limit itself to give an indication rightwards or leftwards in respect of the zero position which is at the center of the dial, and, therefore, must give only a qualitative and not a precise quantitative indication, one can renounce all those technical artifices and expedients which make costly, heavy and cumbersome a true wattmeter. At most, one can forsee a simple damping device, of the air or the electromagnetic type for the moving element of the voltmeter section, above all when the apparatus is realized according to the portable version, in order to safeguard the moving element from the shocks due to transportation; this device may be neglected and omitted if the moving element is made sufficiently sturdy and sprung upon its supports.

The ammeter circuit and the voltmetric circuit must be sufficiently insulated each in respect to the other, in order to be able to withstand the operation voltage-between-lines of the network. One can act above all upon the ammeter movable element, since it is easy to insulate it from the ferromagnetic circuit upon which it acts. There are no insulation problems between the various turns which compose the ammeter circuit, since the voltage drop at the small coil terminals is a few tens of a volt. Since the ammeter circuit has been strongly insulated from the ferromagnetic mass, the voltmeter circuit doesn't need any particular insulation; it will suffice to insulate the ends of the small coil, for the small voltage drop which will take place along it, for the flow of the weak voltmeter current and its own impedance. The detector has been provided with a suitable dial in which one can distinguish a right region and a left region, with appropriate color indications; the needle (indicator) of the moving element is, at rest, situated at the center of the dial. Outside the insulating box, which encloses the whole, the terminals are arranged, which are marked by the numerals 1, 2 and 3 or by the letters R, S, and T to distinguish the three phases.

Figure 3:
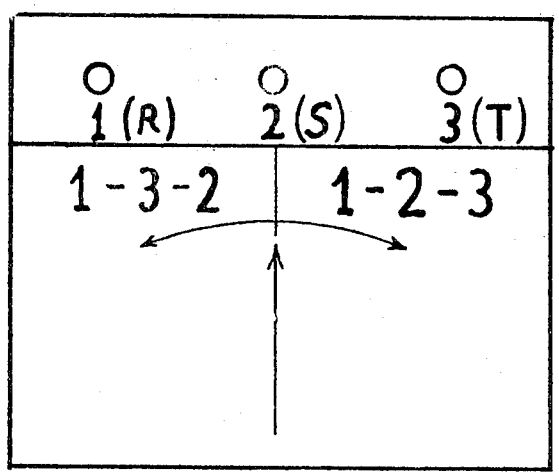
FIG. 3 is a plan representation of the dial of the apparatus according to the invention.

Externally, therefore, the whole appears as it is shown in the plan view of FIG. 3.

Here is now the complete list of the few components of the ensemble according to this first circuit version: a detector (which is indicated by the letter W), three equal resistors, a condenser, three terminals and a box containing the whole.

Figure 2:
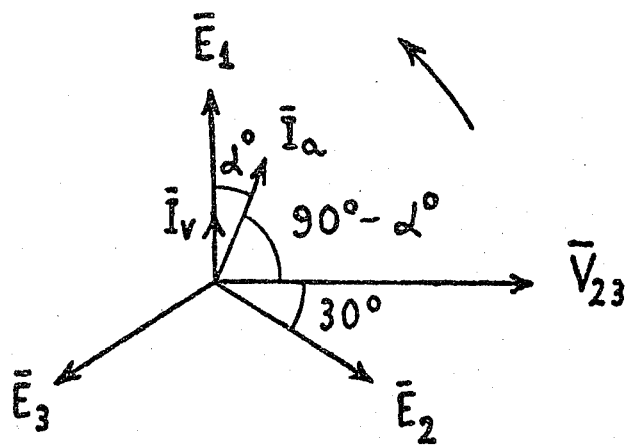
FIG. 2 shows its vectorial diagram.

These elements are interconnected according to the diagram of FIG. 1, and with a first connection to the network, characterized by a correspondence between the symbols of the terminals and the correct cyclical arrangement of the phases, we get the vectorial diagram of FIG. 2, from which the following relation can be derived:

$$C_w = K \cdot I_v \cdot I_a \cdot \cos(I_v, I_a) = K \cdot \widehat{I_v \cdot I_a} \cdot \cos \alpha°,$$

where:
$C_w$ = mean torque acting upon the moving element;
$K$ = constant;
$I_v$ = voltmeter current = $E/(Z_v + R_2) = E/R_2$;
$I_a$ = ammeter current = $V/(Z_a + X_c)$;
$\alpha°$ = phase difference between $I_v$ and $I_a$.

Sine $\alpha°$ is small, the value of the cosine is positive, and, therefore, the needle of the detector shows a deflection toward the positive region of the dial, i.e. right of the center-zero; with reference to FIG. 3, we find the indication: "1-2-3 CORRECT INSERTION". The three phases will be denated by the markings on the terminals of the device. The small angle is due to the many turns forming the ammeter coil of the detector in series with the capacitor C on the phases 2 and 3, and, for a small part, to the loss angle of the capacitor itself. The angle is small because it is $X_c >> Z_a$ (which is the inductive ammeter inductance).

The displacement of the three star voltages is to be considered as practically symmetrical, since the impedance of the voltmeter circuit of the detector, which it is, too, of an inductive nature, is $Z_v << R_2$.

Figure 4:
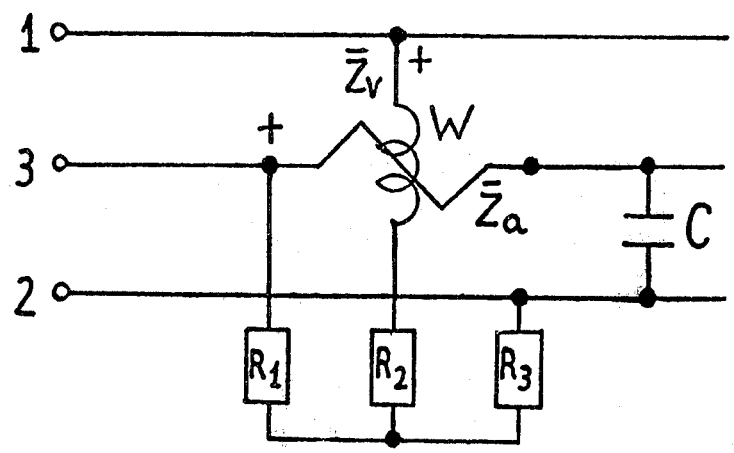
FIG. 4 shows the circuit of FIG. 1, with a different connection with the network.
Figure 5:
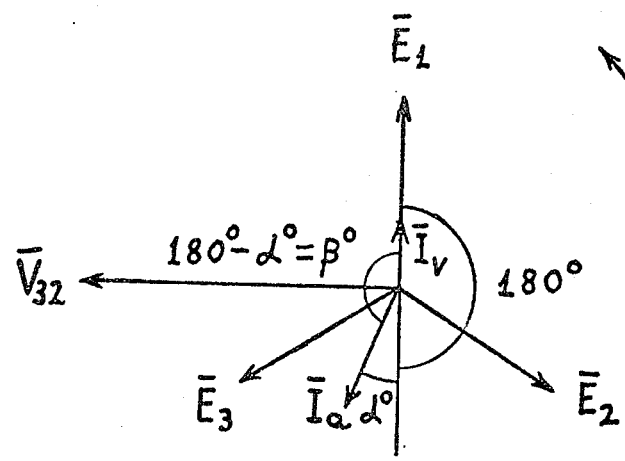
FIG. 5 shows the vectorial diagram of the circuit shown in FIG. 4.

If the same circuit is connected to the network in the way illustrated in FIG. 4, the corresponding vectorial diagram is the diagram shown in FIG. 5, frm which one can derive the following:

$$C_w = K \cdot I_v \cdot I_a \cdot \cos(\overline{I_v, I_a}) = K \cdot I_v \cdot I_a \cdot \cos \beta° = K \cdot I_v \cdot I_a(-\cos \alpha°) = -K \cdot I_v \cdot I_a \cdot \cos \alpha°.$$

The angle $\alpha°$ remains unchanged.

In this case, the pointer of the detector undergoes a deflection toward the negative region of the dial, i.e. to the left of the center-zero; with reference to FIG. 3, we find the indication: "1-3-2 REVERSE TWO PHASES". Substantially, in the two possible cases of connection to the network, the two indications of the instrument are equal as to the amount of the deflection, but opposed in direction: and this is what suffices, in order to obtain that, by reversing any two phases (here we have chosen the exchange between phase 2 and 3, but we could choose any combination) the indication given by the detector is reversed, thus giving to the operator the correct information.

The two indications have equal amplitude but an opposed sense (or direction) since $I_v$ and $I_a$ are always the same, whereas the value of $\cos \alpha°$ is positive in one case, and negative in the other.

Some considerations about the working and the construction of the device

If to the device a phase happens to fail, because of a faulty connection with the network (a case which may happen, above all in the portable version), the pointer will give no noticeable deflection, and, therefore, the operator is not deceived. Indeed, if the phase 1 is lacking, no current flows in the voltmeter section, and the pointer remains motionless. If the phase 2, or the phase 3, are lacking, we have a more than halfed current flow in the voltmeter section, and a very small (in respect to the operation when all the three phases are present) flow in the ammeter circuit; furthermore, these two currents are very much out of phase mutually because of the presence of the capacitor and, therefore, the driving torque which acts upon the moving element, is negligible with respect to the values whch prevail in the case of normal (i.e. correct) operation. The resistors $R_1$ and $R_3$ provide also the quick discharge of the capacitor C, as soon as the instrument has been disconnected, thus preserving the operator from electric discharges if he should touch the terminals of the device.

It is to be observed that, even in the presence of some dissymmetry of the network on the system of the voltages between lines, from which the "star" voltages are determined, we get always a positive deflection and a negative deflection which are safely distinguishable, because of the safety margin which causes the reversal of the pointer deflection to be sure; only a slight difference will be observed in the pointer deflections between the deflection to right and that to left. The thermal effect of the resistors is very small, and therefore the device can remain indefinitely connected to the network, a quality which is absolutely necessary in the "switchboard" versions of the device. Anyway, in the switchboard version, the resistors can be situated outside the container, thus avoiding even this moderate thermal effect for the sensitive element.

The external terminals (external with respect to the insulating box), for the insertion of the small cord for the connection to the network, can be of the setscrew type, clamping screw with knurled insulated nut or of male-female coupling type.

The device works correctly even if an artificial star-center is created with three capacitors to be used as an alternative to the use of three resistors and a ohmic load is inserted between the phases 2 and 3 as an alternative to the capacitor. In this case, it is more difficult to achieve a balance of phase currents, one of which is circulating in the voltmeter section of the detector, by the use of inexpensive capacitors, since the tolerances in the capacitors of the market are always very large, as opposed to the reduced tolerances which are encountered in the resistors, even of an inexpensive type, which are easily and cheaply found on the market.

Another drawback is represented by the thermal effect which is produced by the resistor between the phases 2 and 3: said effect is larger, since the resistor must cause the ammeter current which is widely larger than the voltmeter current. Furthermore, in this case, the pointer is deflected to the left of the center-zero when the insertion into the network is correct, contrary to what is written on the dial of the device (1-3-2: REVERSE TWO PHASES), and to the right of the center-zero when two phases are to be reversed, whereas on the dial is written: "1-2-3 CORRECT INSERTION". In order to avoid this inconvenience, one may reverse the current input to the volt-meter circuit or to the ammeter circuit of the detector with respect to the layout of FIG. 1 and FIG. 4.

A device able to provide two opposed deflection when two phases are reversed can be achieved by substituting in FIG. 1 and in FIG. 4 a capacitor between the phases 2 and 3 by a strongly inductive load. Also, in this case, however, the pointer is deflected toward the left of the center-zero when the connection with the network is correct, and toward the right when two phases are to be reversed. The way by which this inconvenience is eliminated has been already indicated. It is to be observed that a prevailingly inductive load, able to absorb a current sufficient to create the ammeter magnetic field, is always more bulky and heavy than a capacitive load. Furthermore, problems would arise regarding the insulation between the end turns of the ammeter coil, since this should withstand almost the whole voltage-between-lines of the network; the capacitive load, therefore, remains the type of load to be preferred between the phases 2 and 3 in order to achieve an economic and rational industrial realization of the device.

Also in this case, it is possible to create the artificial star-center with the strongly inductive impedances instead of the three resistors and to put a ohmic load between the phases 2 and 3, but all the abovementioned problems arise because of bulk, weight, cheapness, insulation between the end turns of the small coil, thermal effect, as well as the difficulty of getting three equal impedances.

Anyway, the three described modified circuit embodiments, notwithstanding the practical difficulties to be overcome, make always realizable the device even according to these further three versions, and, therefore, the three circuits and related components are claimed by the applicant. Diagrams and formulas are omitted since the case which has been already widely described has certainly illustrated clearly the logic process underlying as well as the corresponding interpretation for those skilled in the art.

A device capable of providing two deflections of the detector's pointer having the same amplitude but opposing directions, can be obtained by feeding the voltmeter section of the detector with the voltage between two lines (phases) and putting in series impedances having characteristics which will be illustrated in the following. Also in this case, a remarkable series of possible circuits is available, for which all the practical and economic considerations are valid which have been already illustrated about the operation with the creation of the artificial star-center, when one wants to pass to the industrial realization of the device. Therefore, diagrams will be shown and formulas will be demonstrated only for that solution which the inventor believes to be the most favourable for manufacture on an industrial scale.

For the other solutions, only the parameters to be changed in the series-connection with the voltmeter or ammeter circuit of the detector shall be described, leaving to the specialist of the art the drawing of the diagrams and of the formulas, since they are always based upon the same logic.

Here is the list of the components: a detector complete with a dial, one/capacitor C, one inductive impedance $Z_L$, one resistor R, three marked terminals, and an insulating box containing the whole.

Figure 6:
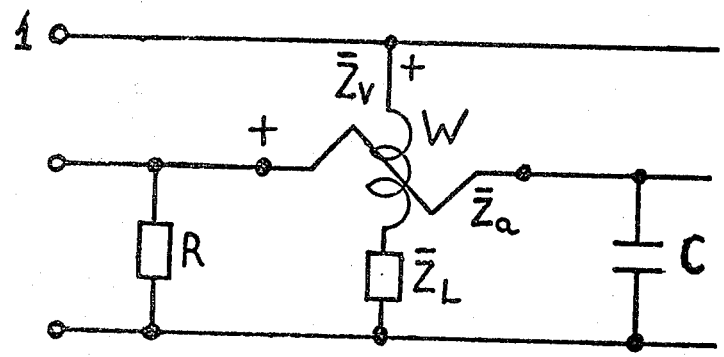
FIG. 6 shows the circuit of the apparatus according to a further version.
Figure 9:
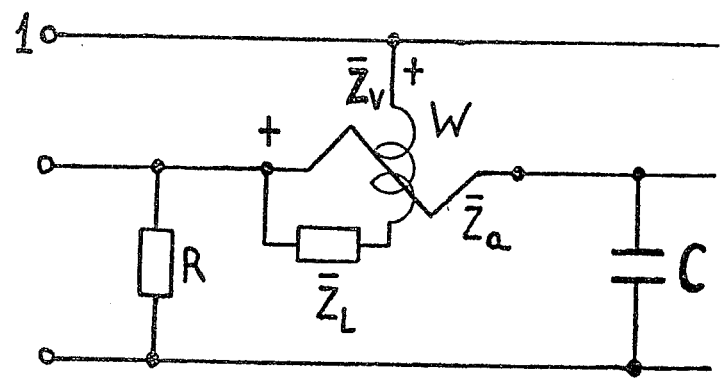
FIG. 9 shows a further circuit version of the apparatus according to the invention.

These few elements can be interconnected, at choice, according to the diagram of FIG. 6 or according to that of FIG. 9. The indicated circuits are two since, even utilizing the same components, the possible connections are two, and both give rise to two opposed indications by the pointer when two of the network three phases are reverse, this being the necessary and sufficient condition so that the device will achieve its objective.

In the diagrams of FIG. 6 and FIG. 9, only the first network wire has been marked: for each of these diagrams, two choices, as usual, will be analyzed. The first choice pertains to the assumption that to the three line wires the complete terminal marking corresponds to FIG. 1, the second choice is related to FIG. 4. By this expedient two diagrams are spared.

Figure 7:
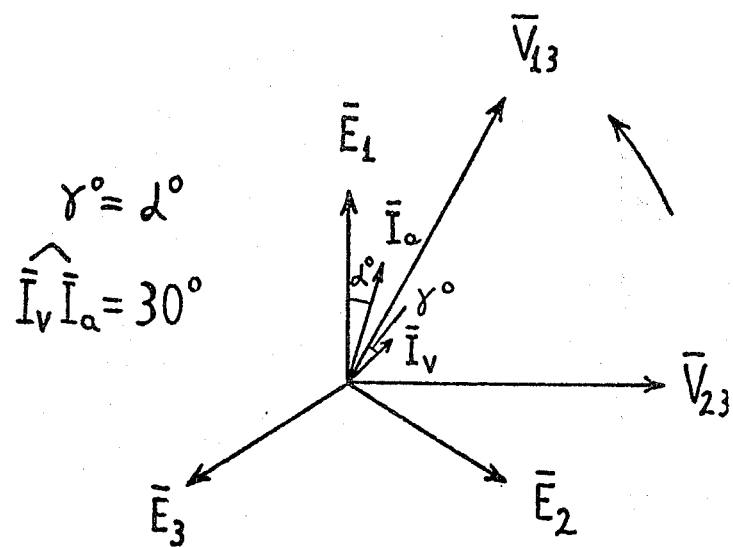
FIGS. 7 and 8 show the vectorial diagrams for the two possible connections of the three network wires with the three terminals.

The vectorial diagram of FIG. 7 derives from the electric diagram of FIG. 6 with the markings, on the line wires, of FIG. 1. From the diagram we get:

$$\widehat{E_1 V_{23}} = 90°; \widehat{V_{13} V_{23}} = 60°$$

$$\widehat{I_a V_{23}} = 90° - \alpha°; \widehat{I_v V_{23}} = 60° - \gamma°$$

$$\widehat{I_a I_v} = \widehat{I_a V_{23}} - \widehat{I_v V_{23}} = (90° - \alpha°) - (60° - \gamma°).$$

By realizing $\gamma° = \alpha°$, we get:

$$\widehat{I_a I_v} = 90° - \alpha° - 60° + \alpha° = 30°.$$

The mean torque which acts upon the moving element of the detector is:

$$C_w = K.I_v.I_a.\cos(\widehat{I_v I_a}) = K.I_v.I_a.\cos 30° = 0,866.K.I_v.I_a,$$

wherein:
$C_w$ = mean torque acting upon the moving element;
K = constant;
$I_v$ = voltmeter current = $V/(Z_v + Z_L) \cong V/Z_L$;
$I_a$ = ammeter current = $V/(Z_a + X_c)$.

The positive deflection of the detector's pointer is to the right of the center-zero, where we can read: "1-2-3 CORRECT INSERTION" (FIG. 3). The phases are indicated by the markings on the terminal of the instrument.

Figure 8:
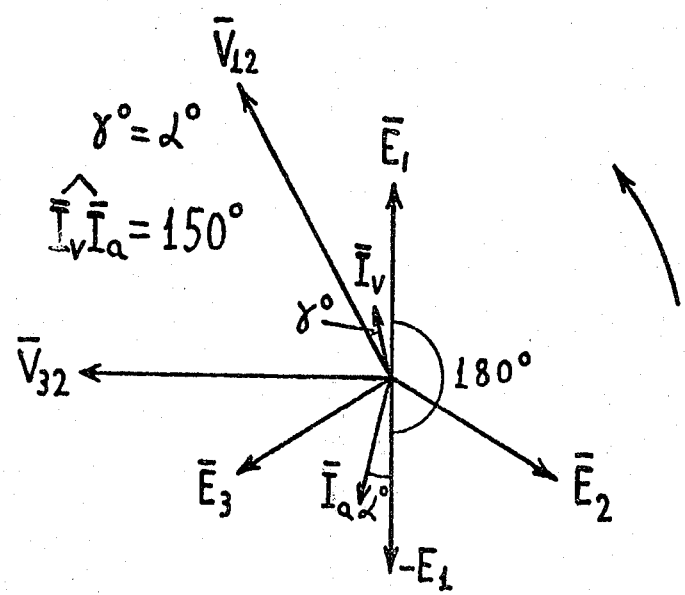

If, in the diagram of FIG. 6, the three line wires are marked in the way which is indicated in FIG. 4, we get the vectorial diagram of FIG. 8, wherefrom we derive:

$$-\widehat{E_1 E_1} = 180°; \widehat{V_{12} E_1} = 30°;$$

$\widehat{I_aE_1}=180°-\alpha°; \widehat{I_vE_1}=30°-\gamma°;$ $\widehat{I_aI_v}=\widehat{I_aE_1}-\widehat{I_vE_1}=(180°-\alpha°)-(30°-\gamma°).$ By realizing $\gamma°=\alpha°$, we get:

$\widehat{I_aI_v}=180°-\alpha°-30°+\alpha°=150°.$

The mean torque acting upon the moving element of the detector is:

$C_w=K.I_v I_a.\cos(\widehat{I_v I_a})=K.I_v I_a.\cos 150°=K.I_v I_a(-\cos 60°)=-0,866.K.I_v I_a.$ The negative deflection of the detector's pointer is to the left of the center-zero, where we read: "1-3-2 REVERSE TWO PHASES" (FIG. 3). Also in this circuit, version, in the two possible cases of connection with the network, the two instrument's indications are of equal amplitude but opposed in sign, which is the sufficient condition in order that, by reversing any two phases (here we have made the example of phases 2 and 3, but the consideration applies for any combination of the two phases, two by two) the indication of the detector will reversed, thus giving the correct information to the operator. The two deflections are equal in amplitude but opposed in sign since $I_v$ and $I_a$ are always the same, whereas the value of the cosine is positive in one case, and negative in the other, without changing its absolute value (about 0.866). The angle $\alpha°$ is due to the many turns composing the ammeter coil of the detector, in series with the capacitor on the phases 2 and 3, and, for a small part, to the loss angle of the capacitor itself. The existence of this angle causes a phase shift less than 90° between the voltage-between-lines which determines the ammeter current, and the current itself. If one did not act to annul its effects, two indications opposed in sense but of different amplitude would be obtained. It is in order to avoid this drawback that an inductive impedance $Z_L$ has been inserted in series with the voltmeter circuit of the detector, instead of inserting a purely ohmic resistor. Thus, $Z_L$ must present an inductive reactance and a resistance such to cause a delaying phase shift ($\gamma°$) between the voltage causing the voltmeter current, and the current itself, which must be equal to the angle $\alpha°$; this is the reason why in the formulae we have written $\gamma°=\alpha°$. By this artifice the value of the cosine is that of a 30° or a 150° angle and is therefore, 0,866 or $-0,866$. The resistor "R" placed rear of the detector serves to quickly discharge the capacitor, once the device has been disconnected from the network. The pointer of the detector remains stationary if a phase is failing, because of a faulty connection with the network. This circuit version offers the advantage that the already contained thermal effect of the resistors is further reduced since, in this case, the resistors are two and not three.

About the other possible and suitable considerations relating to the operation and manufacturing of the device, the reader is invited to refer to what has been previously said in relation with the realization of the device with the artificial star-center.

Figure 10:
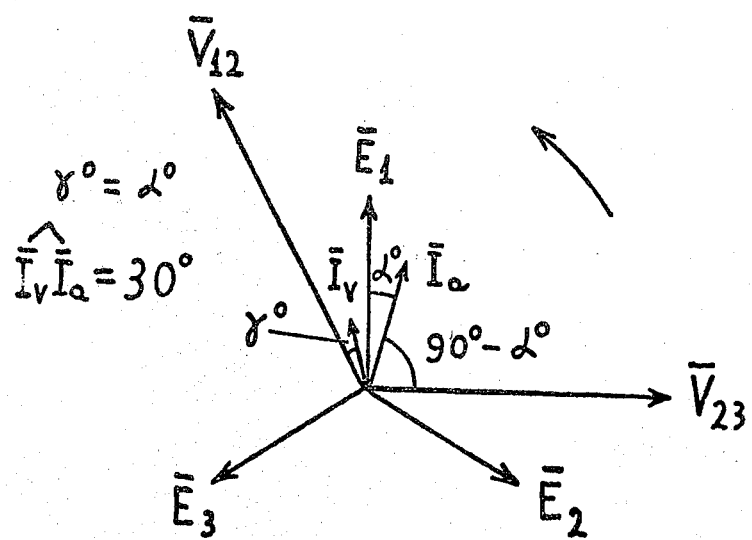
FIGS. 10 and 11 show the vectorial diagrams of the embodiment of FIG. 9.
Figure 11:
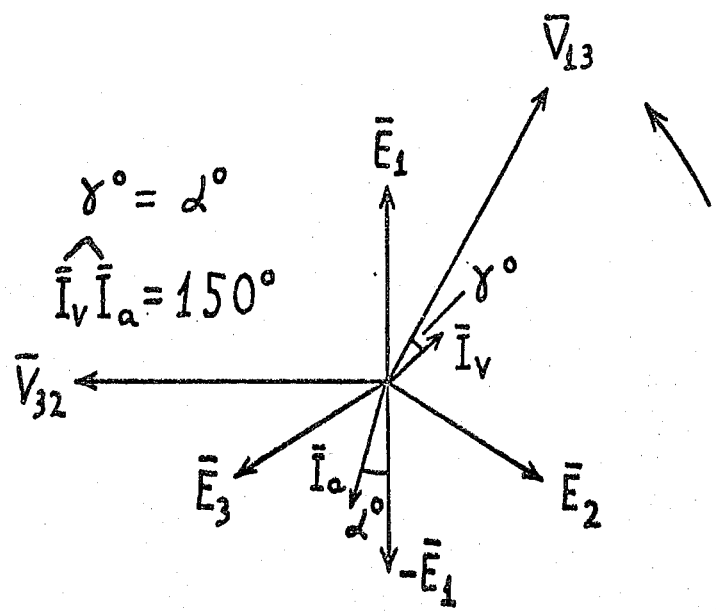
Figure 12:
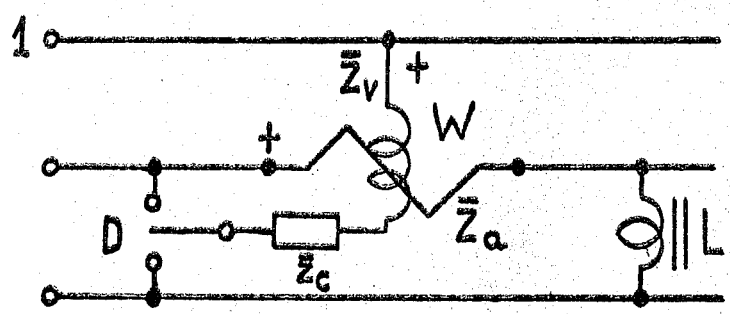
FIG. 12 shows circuit version of the apparatus of FIGS. 6 and 9, with some variations in the components.

The operation according to the interconnection scheme of FIG. 9 may be deduced from the vectorial diagrams of FIG. 10 and FIG. 11, from which it is easy to deduce that one reaches the same results which have just been described: a positive deflection and a negative deflection of the pointer. As it has been already mentioned when treating the circuit version with the artificial star-center, the capacitor placed between the phases 2 and 3 can be substituted by an inductive load, as in FIG. 12. In this case, the resistor "R" between the phases 2 and 3 rear of the detector can be omitted. A switch D has been employed to indicate the two possible interconnections of the components. Diagrams and formulae are omitted, since the underlying logic is always the same. In this case, the phase correction of $I_v$ in order to achieve $\gamma°=\alpha°$ must be effected by the use of a capacitive impedance, which in FIG. 12 has been indicated by the symbol $Z_c$. All the negative, already illustrated, considerations related to the substitution of the capacitive ammeter load by a load of an inductive type, remain valid.

In conclusion, the two circuits which allow an easier realization of the device remain those indicated in FIG. 1 and FIG. 6, or in FIG. 9, since the resistors, the capacitor and the impedance $Z_L$ are easy to find in the market and are inexpensive.

All the other circuits here described or illustrated are claimed because they are operative, even if their industrial realization is more difficult because of the characteristics of some components apted to cause their correct operation.

I claim:

1. An electronic phase-sequence indicator for determining the phase relationships in a three-phase network, comprising:
    a single-phase detector-indicator including a voltmeter circuit having a movable pointer, an ammeter circuit insulated from said voltmeter circuit, and a dial divided into two sectors, said pointer moving between said two sectors and a center portion therebetween;
    three impedances each having substantially equal impedance and star-connected to the three-phase network;
    said voltmeter circuit being connected in series with one of said three impedances and the input of said voltmeter circuit being connected to one of said three phases being designated arbitrarily as phase one;
    a fourth impedance connected between the other two of said three phases; and
    said ammeter circuit being connected to another phase of said three-phase network and to said fourth impedance.

2. An electronic phase-sequence indicator as claimed in claim 1 wherein said impedance is a capacitor.

3. An electronic phase-sequence indicator as claimed in claim 1 wherein said impedance is an inductor.

4. An electronic phase-sequence detector as claimed in claim 1 wherein said three impedances are each a resistor having substantially equal resistances.

5. An electronic phase-sequence indicator as claimed in claim 1 wherein said three impedances are three capacitors, and said fourth impedance is a resistor.

6. An electronic phase-sequence indicator as claimed in claim 1 wherein said three impedances are three inductors and said fourth impedance is a resistor.

7. An electronic phase-sequence indicator for determining the phase relationships in a three-phase network, comprising:
    a single-phase detector indicator including a voltmeter circuit having a movable pointer, an ammeter circuit insulated from said voltmeter circuit, and a dial divided into two sectors, said pointer moving between said two sectors and a center portion therebetween;

a first impedance connected in series with said voltmeter circuit, and said voltmeter circuit and series connected first impedance being connected between an arbitrarily designated phase one and another one of said three phases;

said ammeter circuit being connected in the remaining phase; and a second impedance and a resistor connected between said remaining phase and the other of said three phases.

8. An electronic phase-sequence indicator as claimed in claim 7 wherein said first impedance is an ohmic-inductive impedance and said second impedance is a capacitor.

9. An electronic phase-sequence indicator as claimed in claim 7 wherein said first impedance is an ohmic-capacitive impedance and said second impedance is an inductor.

10. An electronic phase-sequence indicator for determining the phase relationships in a three-phase network, comprising:

a single-phase detector indicator including a voltmeter circuit having a movable pointer, an ammeter circuit insulated from said voltmeter circuit, and a dial divided into two sectors, said pointer moving between said two sectors and a center portion therebetween;

a first impedance connected in series with said voltmeter circuit, and said voltmeter circuit and series connected first impedance being connected between an arbitrarily designated phase one and another one of said three phases;

said ammeter circuit being connected in said another one of said three phases; and a second impedance and a resistor connected between said another one of said three phases and the remaining one of said three phases.

11. An electronic phase-sequence indicator as claimed in claim 10 wherein said first impedance is an ohmic-inductive impedance and said second impedance is a capacitor.

12. An electronic phase-sequence indicator as claimed in claim 9 wherein said first impedance is an ohmic-capacitive impedance and said second impedance is an inductor.

13. An electronic phase-sequence indicator as claimed in claim 9 further comprising a switch for connecting said series connected voltmeter circuit and first impedance to the remaining one of said three phases and disconnecting said voltmeter circuit and series connected first impedance from said another one phase.

* * * * *